United States Patent
Shang et al.

(10) Patent No.: US 12,166,044 B2
(45) Date of Patent: Dec. 10, 2024

(54) ARRAY SUBSTRATE AND DISPLAY PANEL INCLUDING STACKED METAL LAYER TEST UNIT AREA

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Tinghua Shang, Beijing (CN); Lulu Yang, Beijing (CN)

(73) Assignees: BEIJING BOE TECHNOLOGY DEVELOPMENT CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 621 days.

(21) Appl. No.: 17/417,442

(22) PCT Filed: Dec. 25, 2020

(86) PCT No.: PCT/CN2020/139314
§ 371 (c)(1),
(2) Date: Jun. 23, 2021

(87) PCT Pub. No.: WO2021/136084
PCT Pub. Date: Jul. 8, 2021

(65) Prior Publication Data
US 2022/0344372 A1 Oct. 27, 2022

(30) Foreign Application Priority Data
Jan. 3, 2020 (CN) .......................... 202010006825.X

(51) Int. Cl.
*H01L 27/12* (2006.01)
*H01L 25/18* (2023.01)

(52) U.S. Cl.
CPC ............ *H01L 27/124* (2013.01); *H01L 25/18* (2013.01); *H01L 27/1288* (2013.01)

(58) Field of Classification Search
CPC ............... H01L 27/124; H01L 27/1248; H01L 27/1244; H01L 25/18
See application file for complete search history.

(56) References Cited

U.S. PATENT DOCUMENTS

| 8,110,872 | B2 | 2/2012 | Fujimoto |
| 9,293,432 | B2 | 3/2016 | Lin et al. |

(Continued)

FOREIGN PATENT DOCUMENTS

| CN | 102130259 | 7/2011 |
| CN | 102915986 | 2/2013 |

(Continued)

OTHER PUBLICATIONS

Office action from Chinese Application No. 202010006825.X dated Mar. 23, 2021.
(Continued)

*Primary Examiner* — Ida M Soward
(74) *Attorney, Agent, or Firm* — Calfee, Halter & Griswold LLP

(57) ABSTRACT

The array substrate is provided and includes a substrate, a test unit area, first and second flat layers and a terminal area including an input and output terminal areas, the input terminal area includes input terminals for connecting input pins of a driving chip, and the output terminal area includes output terminals for connecting output pins of the driving chip, and each of the input and output terminals includes a second metal layer and a third metal layer disposed on a side (Continued)

of the second metal layer away from the substrate; the second flat layer on a side of the third metal layer away from the substrate and covering edges of the third metal layer; a surface of the first flat layer away from the substrate is not higher than a surface of the second flat layer away from the substrate, in a thickness direction of the substrate.

10 Claims, 4 Drawing Sheets

(56) References Cited

U.S. PATENT DOCUMENTS

| | | | | |
|---|---|---|---|---|
| 9,356,087 | B1* | 5/2016 | Lee | H01L 27/124 |
| 9,570,528 | B2 | 2/2017 | You et al. | |
| 10,861,922 | B2* | 12/2020 | Kim | H10K 59/1213 |
| 2008/0251787 | A1* | 10/2008 | Kim | H01L 22/32 |
| | | | | 257/48 |
| 2009/0140269 | A1* | 6/2009 | Song | H01L 27/124 |
| | | | | 257/E21.531 |
| 2010/0123170 | A1 | 5/2010 | Fujimoto | |
| 2014/0353622 | A1 | 12/2014 | You et al. | |
| 2014/0353644 | A1 | 12/2014 | You et al. | |
| 2015/0144940 | A1* | 5/2015 | Hong | H01L 27/1225 |
| | | | | 438/18 |
| 2015/0294949 | A1 | 10/2015 | Lin et al. | |
| 2016/0041433 | A1* | 2/2016 | Zhang | G02F 1/134309 |
| | | | | 174/262 |
| 2016/0049424 | A1* | 2/2016 | Zhang | H01L 27/124 |
| | | | | 438/151 |
| 2016/0370659 | A1* | 12/2016 | Dong | G02F 1/1337 |
| 2017/0092711 | A1* | 3/2017 | Tsai | H10K 59/131 |
| 2018/0083051 | A1* | 3/2018 | Chan | H01L 27/124 |
| 2018/0151100 | A1* | 5/2018 | Zhou | H05K 5/0017 |
| 2018/0166467 | A1* | 6/2018 | Lai | H01L 27/1218 |
| 2019/0058027 | A1 | 2/2019 | Kim et al. | |
| 2019/0280074 | A1* | 9/2019 | Li | H10K 50/82 |
| 2020/0091021 | A1* | 3/2020 | Lee | H01L 22/34 |
| 2020/0105800 | A1* | 4/2020 | Zhang | H01L 22/34 |

FOREIGN PATENT DOCUMENTS

| | | |
|---|---|---|
| CN | 104218064 | 12/2014 |
| CN | 109188812 | 1/2019 |
| CN | 109411508 | 3/2019 |
| CN | 111180464 | 5/2020 |
| EP | 2808917 A1 | 12/2014 |
| EP | 2808917 B1 | 12/2018 |

OTHER PUBLICATIONS

International Search Report from PCT/CN2020/139314 dated Mar. 24, 2021.
Written Opinion from PCT/CN2020/139314 dated Mar. 24, 2021.

* cited by examiner

ARRAY SUBSTRATE AND DISPLAY PANEL INCLUDING STACKED METAL LAYER TEST UNIT AREA

CROSS-REFERENCE TO RELATED APPLICATIONS

This application is the national stage entry of PCT/CN2020/139314, filed on Dec. 25, 2020 which is based on and claims priority to the Chinese patent application No. 202010006825.X, filed on Jan. 3, 2020 and titled "ARRAY SUBSTRATE AND PREPARATION METHOD THEREOF, DISPLAY PANEL, AND DISPLAY DEVICE", the entire contents of which are incorporated herein by reference.

TECHNICAL FIELD

The present disclosure relates to the displaying technical field, in particular to an array substrate and a preparation method thereof, a display panel and a display device.

BACKGROUND

In flat panel display devices, no matter it is a liquid crystal display panel or an organic light emitting diode display panel, requirement proposed for structure design of the non-display area is increasingly higher. It is desired to provide various functional film layers to meet the needs of binding and testing, and to occupy an area as small as possible so as to achieve a design requirement for a narrow frame.

It should be noted that the information disclosed in the above "Background" section is merely intended to reinforce understanding of the background technology of the present disclosure, accordingly the Background may include information that does not constitute the prior art as already known by an ordinary person skilled in the art.

SUMMARY

An objective of the present disclosure is to provide an array substrate and a preparation method thereof, a display panel and a display device, so as to ensure that a driving chip can be effectively connected in a lapping joint manner.

According to a first aspect of the present disclosure, an array substrate is provided. The array substrate includes:
  a substrate having a display area and a non-display area on at least one side of the display area;
  a test unit area in the non-display area of the substrate and including a plurality of test units, in which each of the test units includes a test switch and a test signal line disposed on a side of the test switch away from the substrate, and the test signal line includes a first metal layer;
  a first flat layer on a side of the first metal layer away from the substrate and covering the first metal layer;
  a terminal area, in the non-display area of the substrate and including an input terminal area and an output terminal area respectively located on opposite sides of the test unit area, in which the input terminal area includes a plurality of input terminals for connecting input pins of a driving chip, and the output terminal area includes a plurality of output terminals for connecting output pins of the driving chip, and each of the input terminals and the output terminals includes a second metal layer and a third metal layer disposed on a side of the second metal layer away from the substrate;
  a second flat layer on a side of the third metal layer away from the substrate and covering edges of the third metal layer;
  wherein a surface of the first flat layer away from the substrate is not higher than a surface of the second flat layer away from the substrate in a thickness direction of the substrate.

In an exemplary embodiment of the present disclosure, the test switch is a thin film transistor. Each of the input terminals and the output terminals further include a second gate layer and a second insulating layer disposed on a side of the second gate layer away from the substrate, the second metal layer is disposed on a side of the second insulating layer away from the substrate and electrically connected with the second gate layer through a via hole disposed on the second insulating layer.

In an exemplary embodiment of the present disclosure, the first flat layer also covers edges of the second metal layer, and the third metal layer covers a portion of the second metal layer that is not covered by the first flat layer.

In an exemplary embodiment of the present disclosure, a projection of the third metal layer on the substrate covers a projection of the second metal layer on the substrate, and an area of the projection of the third metal layer is larger than an area of the projection of the second metal layer.

In an exemplary embodiment of the present disclosure, a projection of the first flat layer on the substrate and a projection of the second flat layer on the substrate are not overlapped, and have a gap therebetween.

In an exemplary embodiment of the present disclosure, a thickness of a portion of the first flat layer covering the first metal layer is smaller than a thickness of a portion of the second flat layer covering the third metal layer.

In an exemplary embodiment of the present disclosure, the first metal layer and the second metal layer are disposed on the same layer.

In an exemplary embodiment of the present disclosure, the test unit includes a buffer layer, a polysilicon layer, a first insulating layer, a first gate layer, a third insulating layer, a third gate layer, a dielectric layer, the first metal layer, and the first flat layer stacked on the substrate.

In an exemplary embodiment of the present disclosure, the thin film transistor comprises the buffer layer, the polysilicon layer, the first insulating layer and the first gate layer form a thin film transistor as the test switch.

In an exemplary embodiment of the present disclosure, the thin film transistor is electrically connected to the test signal line through a via hole of the third insulating layer.

In an exemplary embodiment of the present disclosure, the first flat layer is formed by using a halftone mask.

According to a second aspect of the present disclosure, a preparation method of an array substrate is provided. The preparation method includes:
  providing a substrate having a display area and a non-display area, in which the non-display area is divided into an input terminal area, an output terminal area and a test unit area, and the input terminal area and the output terminal area are located on opposite sides of the test unit area;
  forming a first metal layer in the test switch and the test signal line of the test unit area, and forming a second metal layer in the input terminal area and the output terminal area;

forming a first flat layer at least covering the first metal layer on a side of the first metal layer away from the substrate;

forming a third metal layer on a side of the second metal lay away from the substrate;

forming a second flat layer covering edges of the third metal layer on a side of the third metal layer away from the substrate, in which a surface of the first flat layer away from the substrate is not higher than a surface of the second flat layer away from the substrate.

In an exemplary embodiment of the present disclosure, the first metal layer and the second metal layer are formed by the same patterning process.

In an exemplary embodiment of the present disclosure, the first flat layer also covers edges of the second metal layer when forming the first flat layer, and the third metal layer covers a portion of the second metal layer that is not covered by the second flat layer when forming the third metal layer.

In an exemplary embodiment of the present disclosure, a projection of the first flat layer on the substrate and a projection of the second flat layer on the substrate are not overlapped, and have a gap therebetween.

In an exemplary embodiment of the present disclosure, the first flat layer is formed by using a halftone mask.

In an exemplary embodiment of the present disclosure, a projection of the third metal layer on the substrate covers a projection of the second metal layer on the substrate, and an area of the projection of the third metal layer is larger than an area of the projection of the second metal layer.

In an exemplary embodiment of the present disclosure, a thickness of a portion of the first flat layer covering the first metal layer is smaller than a thickness of a portion of the second flat layer covering the third metal layer.

In an exemplary embodiment of the present disclosure, the preparation method of the array substrate further includes:

sequentially forming a buffer layer, a polysilicon layer, and a first insulating layer with a via hole which are stacked in the test unit area;

forming a first gate layer and a second gate layer in the test unit area and the terminal area by a one-step patterning process;

forming a third insulating layer with a via hole in the test unit area and the terminal area by a one-step patterning process;

forming a third gate layer in the test unit area;

forming a dielectric layer in the test unit area and the terminal area by a one-step patterning process.

According to a third aspect of the present disclosure, a display panel is provided. The display panel includes the above-mentioned array substrate and a driving chip, wherein the driving chip includes a plurality of input pins and a plurality of output pins; the input pins are bound to the input terminals, and the output pins are bound to the output terminals.

According to a fourth aspect of the present disclosure, a display device including the above-mentioned display panel is provided.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate embodiments consistent with the invention and, together with the description, serve to explain the principles of the invention. Apparently, the drawings in the following description are only for illustrating some embodiments of the present disclosure and those of ordinary skill in the art can also derive other drawings based on the drawings without paying any creative labor.

DETAILED DESCRIPTION

Figure 1:
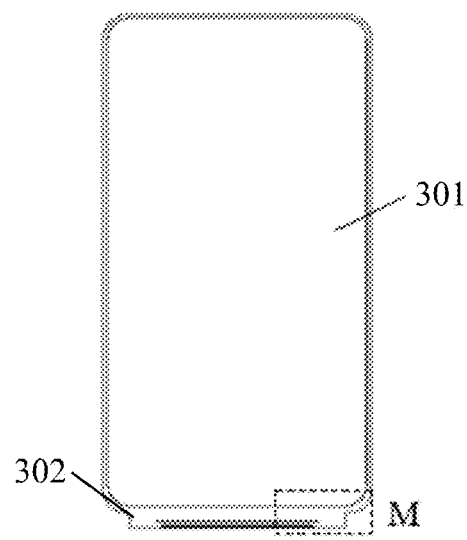
FIG. 1 is a schematic view of a mobile phone according to an embodiment.

Exemplary embodiments will now be described more fully with reference to the accompanying drawings. However, the exemplary embodiments may be embodied in a variety of forms and should not be construed as being limited to the embodiments set forth herein. On the contrary, the embodiments are provided to make the present disclosure comprehensive and through and to fully convey the concept of the exemplary embodiments to those skilled in the art. The same reference signs in the drawings denote the same or similar structures, and detailed descriptions thereof will be omitted. In addition, the drawings are merely schematic illustrations of the present disclosure and are not necessarily drawn to scale.

Although relative terms such as "above" and "under" are used herein to describe the relationship of one component relative to another component, such terms are used herein only for the sake of convenience, for example, in the direction shown in the figure, it should be understood that if the referenced device is inversed upside down, a component described as "above" will become a component described as "under". When a structure is described as "above" another structure, it probably means that the structure is integrally formed on another structure, or, the structure is "directly" disposed on another structure, or, the structure is "indirectly" disposed on another structure through an additional structure.

Words such as "one", "an/a", "the" and "said" are used herein to indicate the presence of one or more elements/component parts/and others. Terms "including", and "having" have an inclusive meaning which means that there may be additional elements/component parts/and others in addition to the listed elements/component parts/and others. Terms "first", "second", and "third" are used herein only as markers, and they do not limit the number of objects modified after them.

Figure 2:
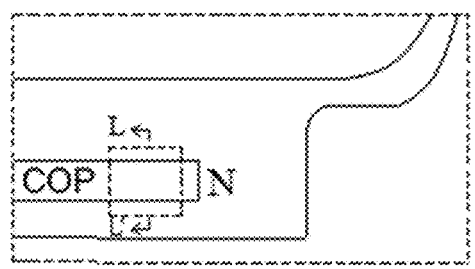
FIG. 2 is a partial enlarged view of part M in FIG. 1.
Figure 3:
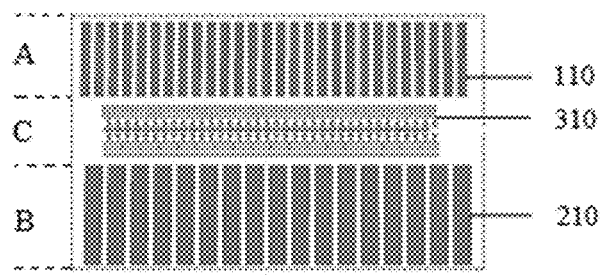
FIG. 3 is a partial enlarged view of part N in FIG. 2.

Generally, the non-display area of the array substrate is provided with an input terminal and an output terminal, for binding an input pin and an output pin of a driving chip so as to drive a thin film transistor (TFT) array. At the same time, in order to detect pixels, it is required to provide a test unit in the non-display area of the array substrate. Taking the mobile phone display screen shown in FIG. 1 as an example, the mobile phone display screen includes a display area 301 and a non-display area 302, the non-display area 302 of the array substrate includes a COP (chip on panel) package area at the bottom. Referring to FIG. 2 as a partial enlarged view of part M in FIG. 1, both the test unit area and the terminal area are located in the COP package area. FIG. 3 is a partial enlarged view of part N in FIG. 2. Referring to FIG. 3, the terminal area includes an input terminal area A and an output terminal area B, and a test unit area C is located between the input terminal area A and the output terminal B. The input terminal area includes a plurality of input terminals 210, the output terminal area includes a plurality of output terminals 110, and the test unit area C includes a plurality of test units 310.

Figure 10:
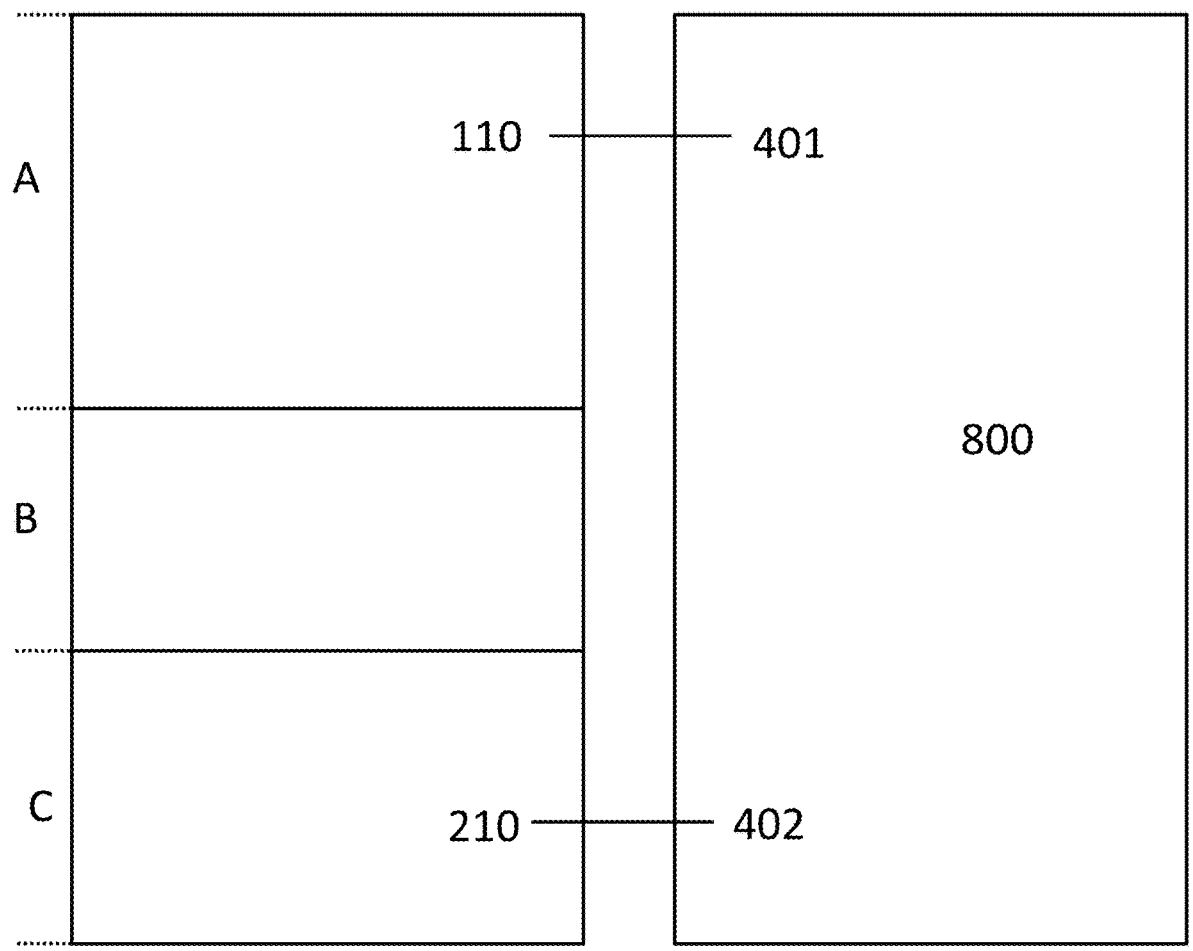
FIG. 10 is a schematic view of a connection between an input terminal and an input pin of the driving chip and a connection between an output terminal and an output of the driving chip.

The test unit includes a test switch and a test signal line, and the test switch is configured to represent TFT characteristics in the display area through the test signal line. The terminal area on the array substrate has input terminals 210 for connecting input pins of the driving chip and output terminals 110 for connecting output pins of the driving chip. The array substrate performs signal transmission through the input terminals 210 and the output terminals 110. As illustrated in FIG. 10, it schematically shows a connection between an input terminal 210 and an input pin 402 of the driving chip 800 and a connection between an output terminal 110 and an output pin 401 of the driving chip 800. It should be noted that FIG. 10 is only a schematic diagram and does not indication the positional relationship between the array substrate and the driving chip. Generally, the input terminals 210 and the output terminals 110 have the same structure.

In order to realize a narrow frame design, the test unit area is arranged between the input terminal area and the output terminal area to reduce an occupied area of the non-display area.

Since it is required to bind the driving chip to the input terminals 210 and the output terminals 110, structures of the test unit and the input and output terminals are reasonably arranged to realize effective connection in a lapping joint manner and avoid poor crimping or breakage of the chip.

Figure 4:
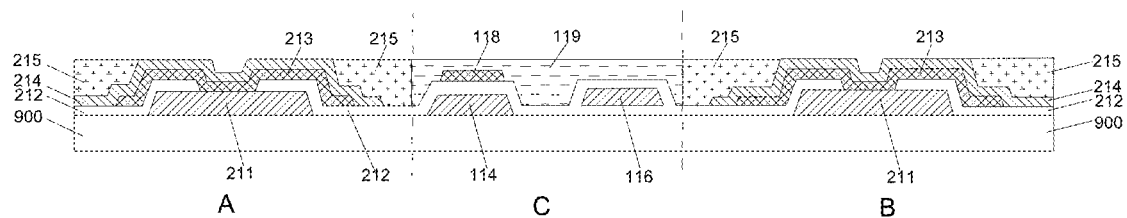
FIG. 4 is a schematic view of a first type of a film layer structure of an array substrate according to an embodiment of the present disclosure.

An embodiment of the present disclosure provides an array substrate, and FIG. 4 is a sectional view of the film layer structure of the terminal and the test unit of the array substrate according to the embodiment of the present disclosure, corresponding to a sectional view taken along the line L-L' in FIG. 2. A represents the input terminal area, B represents the output terminal area, and C represents the test unit area. It should be noted that A and B in the drawings are only used to distinguish the input terminal area from the output terminal area, rather than limit positions of the input terminal area and the output terminal area as shown. The positions of the input terminal area and the output terminal area as shown can also be exchanged.

Referring to FIG. 4, the array substrate includes a substrate 900, a test unit area, a terminal area, a first flat layer 119 and a second flat layer 215. The substrate 900 has a display area and a non-display area. The test unit area C is located in the non-display area, and includes a plurality of test units 310 for testing performance of the array substrate. The test unit 310 includes a test switch and a test signal line disposed on a side of the test switch away from the substrate 900, and the test signal line includes a first metal layer 118. The first flat layer 119 is located on a side of the first metal layer 118 away from the substrate 900, and covers the first metal layer 118. The terminal area is located in the non-display area, and includes an input terminal area A and an output terminal area B which are disposed on opposite sides of the test unit area. The input terminal area A includes a plurality of input terminals for connecting input pins of the driving chip, and the output terminal area B includes a plurality of output terminals for connecting output pins of the driving chip. The input terminals and the output terminals have the same structure, each of the input terminals and the output terminals includes a second metal layer 213 and a third metal layer 214 disposed on a side of the second metal layer 213 away from the substrate 900. The second flat layer 215 is located on a side of the third metal layer 214 away from the substrate 900, and covers edges of the third metal layer 214. In a thickness direction of the substrate 900, a surface of the first flat layer 119 away from the substrate 900 is not higher than a surface of the second flat layer 215 away from the substrate 900.

The array substrate according to this embodiment is provided with one layer (i.e., the first flat layer 119) above the first metal layer 118 in the test unit area, and an upper surface of the first flat layer 119 is flush with or lower than an upper surface of the second flat layer 215 in the terminal area, so that a middle part of the driving chip (IC) cannot be protruded when the driving chip is bound, avoiding breakage. At the same time, the pins on both ends of the IC can be bound to the terminals more firmly, avoiding poor crimping and finally achieving effective lapping joint of the IC.

The array substrate according to this embodiment of the present disclosure will be described in detail below.

Figure 5:
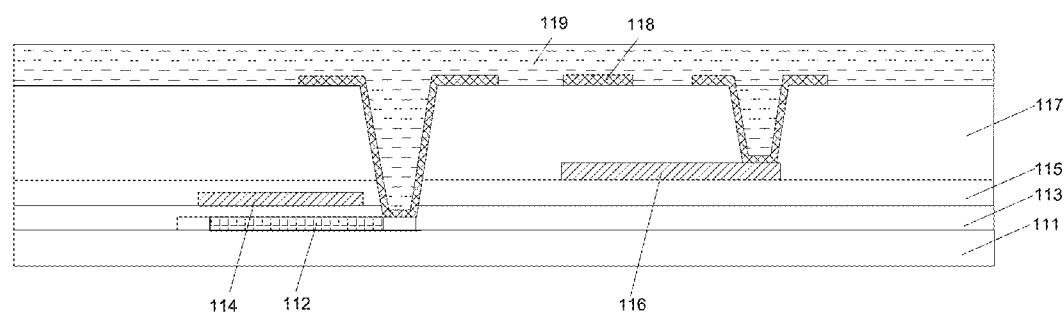
FIG. 5 is a schematic view of a film layer structure of a test unit in the array substrate of the embodiment.

In this embodiment, the test switch adopts a thin film transistor, and referring to FIG. 5, it is a specific film layer stacked structure of the test unit, which includes a buffer layer 111, a polysilicon layer 112, a first insulating layer 113 (with a via hole), a first gate layer 114, a third insulating layer 115 (with a via hole), a third gate layer 116, a dielectric layer 117, a first metal layer 118, a first flat layer 119 and the like stacked on the substrate 900. The buffer layer 111, the polysilicon layer 112, the first insulating layer 113 and the first gate layer 114 are configured to form a thin film transistor as a test switch. It should be noted that a source electrode and a drain electrode are not shown in the figure due to position relationship of the cross sections. In fact, the thin film transistor further includes source and drain electrodes. The remaining film layers are provided with test signal lines for transmitting test signals. The thin film transistor is electrically connected to the test signal line through the via hole of the third insulating layer 115. The first flat layer 119 covers the first metal layer 118 for protecting the first metal layer 118.

As shown in FIG. 4, an example of structures of the input terminal and the output terminal in this embodiment is shown, each of the input terminal and the output terminal includes a second gate layer 211, a second insulating layer 212 (with a via hole), a second metal layer 213, a third metal layer 214 and a second flat layer 215 which are sequentially stacked, and the second flat layer 215 covers edges of the third metal layer 214 for protecting sides of the third metal layer 214. In an ideal situation, an upper surface of the first metal layer 118 should not be higher than an upper surface of the third metal layer 214, so that an upper surface of the first flat layer 119 above the first metal layer may be not higher than an upper surface of the second flat layer 215.

It should be noted that a shape of the film layer as shown is only briefly illustrative, rather than limitative. In the formation process, the film layers of the same material in the test unit area and the terminal area may be formed by the same patterning process to simplify the preparation process. In the drawings, it is indicated that the same filling lines may be formed by the same materials, and the same reference numbers may be formed by one-step patterning process. For example, the first gate layer 114 of the test unit area and the second gate layer 211 of the terminal area may be formed by a one-step patterning process using metal Mo, that is, a Gate1 layer is formed. The first insulating layer 113 of the test unit area and the second insulating layer 212 of the terminal area may be formed by a one-step patterning process using silicon oxide or silicon nitride, that is, a GI1 layer is formed. The first metal layer 118 of the test unit area and the second metal layer 213 of the terminal area may be disposed on the same layer, that is, they may be formed by a one-step patterning process. The first gate layer 114 and the third gate layer 116 of the test unit area may be formed by different patterning processes using metal Mo. The above methods for forming film layers are only illustrative, rather than limitative. In addition, the materials of the above-mentioned film layers may also be other materials that are not listed herein.

Based on the above structures of the input terminals and the output terminals, the second metal layer 213 is directly connected with the third metal layer 214 through the terminals in this embodiment, thereby simplifying the whole film layer stacking process, and meanwhile increasing the contact area of the two metal layers, and reducing the electrical resistance, so that the respective metal layers may be made to have a narrower width to be suitable for the narrower frame design.

In this embodiment, a titanium-aluminum-titanium composite metal layer is used as the metal layer. If the side of the metal layer is exposed, aluminum in the middle is easily corroded due to high activity thereof, a channel formed after corrosion is very likely to communicate the external environment with the effective display area, resulting in the breakage of the inorganic packaging layer, and thus causing water and oxygen to enter the AA area from the outside through the channel and eroding the light-emitting material. Therefore, in addition to the third metal layer 214, the edges of the second metal layer 213 also need to be protected.

In an embodiment, with reference to FIG. 4, a projection of the third metal layer 214 on the substrate 900 covers a projection of the second metal layer 213 on the substrate 900, and an area of the projection of the third metal layer 214 is larger than an area of the projection of the second metal layer 213. That is, the third metal layer 214 completely covers the second metal layer 213, and covers sides of the second metal layer 213 so as to protect the sides of the second metal layer 213 by the third metal layer 214. Meanwhile, since the third metal layer 214 has a larger area, the second metal layer 213 cannot be mistakenly etched during an etching process.

Figure 6:
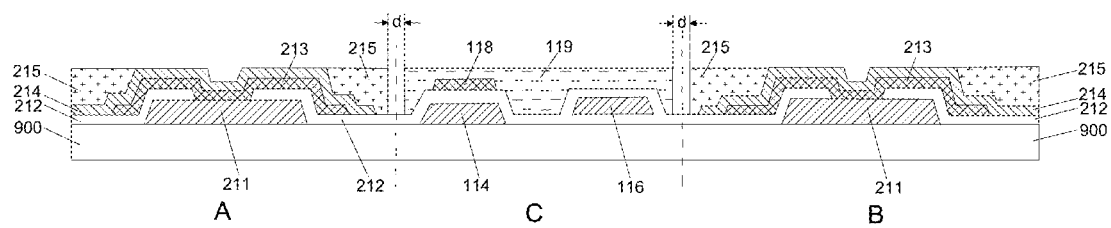
FIG. 6 is a schematic view of a second type of a film layer structure of the array substrate according to the embodiment.

In an embodiment, referring to FIG. 6, projections of the first flat layer 119 and the second flat layer 215 on the substrate are not overlapped and there is a gap d therebetween, that is, an opening area of the mask at the time of forming the second flat layer 215 is larger than the opening area of the mask at the time of forming the first flat layer 119, so that a certain interval may be formed between the first flat layer 119 and the second flat layer 215, in this way, to avoid overlapping with the first flat layer 119 of the test unit area when the second flat layer 215 is formed, so that the stacked film layers of the test unit area becomes thicker, resulting in the formation of a structure with higher in the middle and lower on both sides.

Figure 7:
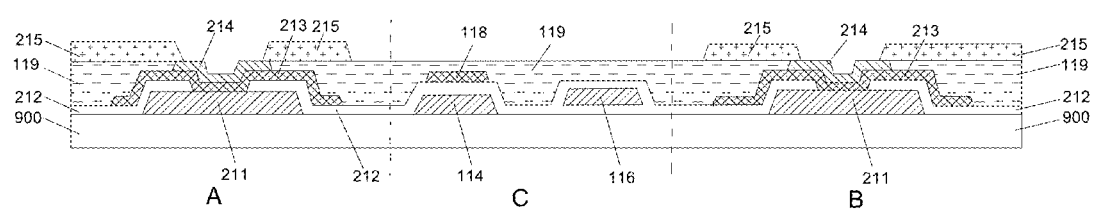
FIG. 7 is a schematic view of a third type of a film layer structure of the array substrate according to the embodiment.

In an embodiment, referring to FIG. 7, the first flat layer 119 of the test unit also covers edges of the second metal layer 213 of the terminal to protect the edges of the second metal layer 213, and the third metal layer 214 covers a portion of the second metal layer 213 that is not covered by the first flat layer 119. Therefore, when the first flat layer 119 is formed, an area thereof is expanded to the terminal area so that it can cover the edges of the second metal layer 213. Meanwhile, the sides of the second metal layer 213 are covered by using the first flat layer 119, so as to not only protect sides of the second metal layer 213, but also prevent mistakenly etching of the second metal layer 213 caused by over-etching due to process deviation when etching the third metal layer 214 of.

In an embodiment, referring to FIG. 7, a thickness of the portion of the first flat layer 119 covering the first metal layer 118 is smaller than the thickness of the portion of the second flat layer 215 covering the third metal layer 214. Since the second flat layer 215 is located in the terminal area, a flat layer with conventional thickness may be formed above the third metal layer 214 by using a conventional mask, and the first flat layer 119 is located in the test unit area, in order to reduce the thickness of the film layer of the test unit as much as possible, a halftone mask may be used to form a flat layer with a thinner thickness on the first metal layer 118. It should be noted that the thicknesses of the flat layer above the metal layer only in the two areas are compared, and a relationship between thicknesses of the flat layers at other positions in the two areas may be same or different. Since the upper surfaces of the flat layers are flush, it is available to make sure that the upper surface of the entire first flat layer 119 is not higher than the upper surface of the second flat layer 215.

Figure 8:
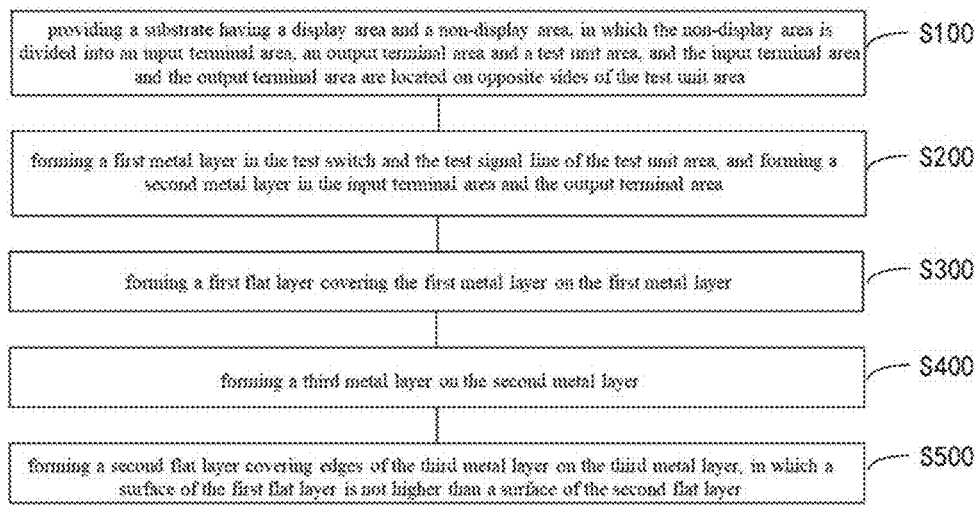
FIG. 8 is a flowchart of a preparation method of an array substrate according to the embodiment.

An embodiment of the present disclosure also provides a preparation method of an array substrate. Referring to FIG. 8, the preparation method specifically includes:

S100, providing a substrate 900 having a display area and a non-display area, in which the non-display area is divided into an input terminal area, an output terminal area and a test unit area, and the input terminal area and the output terminal area are located on opposite sides of the test unit area;

S200, forming a first metal layer 118 in the test switch and the test signal line of the test unit area, and forming a second metal layer 213 in the input terminal area and the output terminal area;

S300, forming a first flat layer 119 covering the first metal layer 118 on the first metal layer 118;

S400, forming a third metal layer 214 on the second metal layer 213;

S500, forming a second flat layer 215 covering edges of the third metal layer 214 on the third metal layer 214, in which a surface of the first flat layer 119 is not higher than a surface of the second flat layer 215.

In this embodiment, when forming the structure shown in FIG. 6, S100 includes forming a bottom film layer of the terminal and the test unit on the substrate 900, specifically:

S110, sequentially forming a buffer layer 111, a polysilicon layer 112, and a first insulating layer 113 with a via hole which are stacked in the test unit area;

S120, forming a first gate layer 114 and a second gate layer 211 in the test unit area and the terminal area by a one-step patterning process;

S130, forming a third insulating layer 115 with a via hole in the test unit area and the terminal area by a one-step patterning process;

S140, forming a third gate layer 116 in the test unit area;

S150, forming a dielectric layer 117 in the test unit area and the terminal area by a one-step patterning process.

It should be noted that the above-mentioned method is illustrated by taking the structure shown in FIG. 5 as an example, when the bottom film layer of the terminal and the test unit is of other structures, the preparation method can be changed accordingly, and will not be repeated any more herein.

In this embodiment, when the first metal layer 118 in the test unit area and the second metal layer 213 in the terminal area are formed in S200, they may be formed by a one-step patterning process.

In this embodiment, when the first flat layer 119 is formed in S300, the first flat layer 119 also covers edges of the second metal layer 213 to protect the sides of the second metal layer 213. Accordingly, when the third metal layer 214 is formed in S500, the third metal layer 214 covers a portion of the second metal layer 213 that is not covered by the first flat layer 119.

In this embodiment, the projections of the first flat layer 119 formed in S300 and the second flat layer 215 formed in S400 on the substrate are not overlapped and there is a gap d therebetween to prevent the film layers from being stacked. Specifically, an opening area of the mask when the second flat layer 215 is formed in S400 is larger than the opening area of the mask when the first flat layer 119 is formed in S300, so as to ensure that the first flat layer 119 and the second flat layer 215 are not overlapped.

In this embodiment, the second flat layer 215 may use a conventional mask to form a flat layer with the conventional thickness above the edges of the third metal layer 214, and the first flat layer 119 uses a halftone mask to form a flat layer with the thinner thickness above the first metal layer 118, so as to reduce the thickness of the film layer of the test unit. The halftone mask makes use of the partial light transmission of grating, to expose the photoresist incompletely, and thus form a thinner film layer.

It should be noted that although the steps of the preparation method of the array substrate in the present disclosure are described in a specific order in the figures, it does not require or imply that these steps must be performed in the specific order, or that the steps shown must be all performed to achieve the desired results. Additionally or alternatively, some of the steps may be omitted, or several steps thereof may be combined into one step, and/or one step may be decomposed into several steps.

Figure 9:
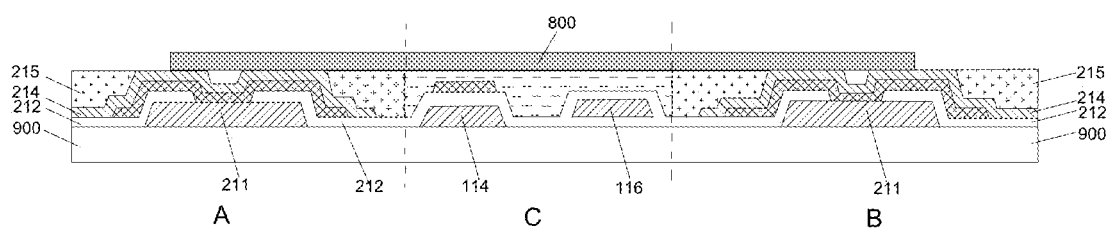
FIG. 9 is a structural schematic view of a display panel according to the embodiment.

An embodiment of the present disclosure also provides a display panel. As shown in FIG. 9, the display panel includes the above-mentioned array substrate and a driving chip 800. The driving chip 800 includes a plurality of input pins and a plurality of output pins. The input pins are bound to the input terminals, and the output pins are bound to the output terminals. Taking FIG. 9 as an example, since the thickness of the film layer in the test unit area of the array substrate is equal to or less than that of the terminal area on both sides, when the driving chip 800 is connected in the lapping joint manner, there will be no problem of bulging in the middle part, to ensure the normal lapping joint of the driving chip 800 and the stable structure, and thus ensuring the normal display of the panel and improving the product yield. Meanwhile, the film layer in the terminal area simplifies the preparation process of the whole panel and improves the yield efficiency of the products.

An embodiment of the present disclosure also provides a display device, which includes the above-mentioned display panel. Therefore, the display device has the same technical effect as the display panel.

The type of the display device is not particularly limited, and may be a liquid crystal display device, an organic electroluminescent display device, or the like. The specific application of the display device is not particularly limited, and may be used for display products commonly used in the field, such as liquid crystal displays, mobile devices such as mobile phones, wearable devices such as watches, VR devices, and the like. Respective selection can be made by the person skilled in the art according to the specific use of the display device, which will not be repeated any more herein.

Other embodiments of the present disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and embodiments be considered as exemplary only, with a true scope and spirit of the present disclosure being indicated by the following claims.

What is claimed is:

1. An array substrate comprising:
    a substrate having a display area and a non-display area on at least one side of the display area;
    a test unit area in the non-display area of the substrate and comprising a plurality of test units, wherein each of the test units comprises a test switch and a test signal line disposed on a side of the test switch away from the substrate, and the test signal line comprises a first metal layer; the test unit comprises a buffer layer, a polysilicon layer, a first insulating layer, a first gate layer, a third insulating layer, a third gate layer, a dielectric layer, the first metal layer, and the first flat layer stacked on the substrate; and the buffer layer, the polysilicon layer, the first insulating layer and the first gate layer form a thin film transistor as the test switch;
    a first flat layer on a side of the first metal layer away from the substrate and covering the first metal layer;
    a terminal area in the non-display area of the substrate and comprising an input terminal area and an output terminal area respectively located on opposite sides of the test unit area, wherein the input terminal area comprises a plurality of input terminals for connecting input pins of a driving chip, and the output terminal area comprises a plurality of output terminals for connecting output pins of the driving chip, and each of the input terminals and the output terminals comprises a second metal layer and a third metal layer disposed on a side of the second metal layer away from the substrate;
    a second flat layer on a side of the third metal layer away from the substrate and covering edges of the third metal layer;
    wherein a surface of the first flat layer away from the substrate is not higher than a surface of the second flat layer away from the substrate, in a thickness direction of the substrate.

2. The array substrate according to claim 1, wherein
    each of the input terminals and the output terminals further comprises a second gate layer and a second insulating layer disposed on a side of the second gate layer away from the substrate, the second metal layer is disposed on a side of the second insulating layer away from the substrate and electrically connected with the second gate layer through a via hole disposed on the second insulating layer.

3. The array substrate according to claim 1, wherein the first flat layer also covers an edge of the second metal layer, and the third metal layer covers a portion of the second metal layer that is not covered by the first flat layer.

4. The array substrate according to claim 1, wherein a projection of the third metal layer on the substrate covers a projection of the second metal layer on the substrate, and an area of the projection of the third metal layer is larger than an area of the projection of the second metal layer.

5. The array substrate according to claim 4, wherein a projection of the first flat layer on the substrate and a projection of the second flat layer on the substrate are not overlapped and have a gap therebetween.

6. The array substrate according to claim 1, wherein a thickness of a portion of the first flat layer covering the first metal layer is smaller than a thickness of a portion of the second flat layer covering the third metal layer.

7. The array substrate according to claim 1, wherein the first metal layer and the second metal layer are disposed on the same layer.

8. A display panel comprising the array substrate according to claim 1 and a driving chip, in which the driving chip comprises a plurality of input pins and a plurality of output pins; the input pins are bound to the input terminals, and the output pins are bound to the output terminals.

9. The array substrate according to claim 1, wherein the thin film transistor is electrically connected to the test signal line through a via hole of the third insulating layer.

10. The array substrate according to claim 1, wherein the first flat layer is formed by using a halftone mask.

* * * * *